(12) United States Patent
Birang et al.

(10) Patent No.: US 6,554,003 B1
(45) Date of Patent: Apr. 29, 2003

(54) METHOD AND APPARATUS FOR CLEANING A THIN DISC

(75) Inventors: Manoocher Birang, Los Gatos, CA (US); Bruno Strul, Portola Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 158 days.

(21) Appl. No.: 09/698,819

(22) Filed: Oct. 26, 2000

Related U.S. Application Data

(60) Provisional application No. 60/162,741, filed on Oct. 30, 1999, and provisional application No. 60/162,805, filed on Nov. 1, 1999.

(51) Int. Cl.$^7$ .................................................. B08B 6/00
(52) U.S. Cl. ........................ 134/1.3; 134/86; 134/153; 134/184; 310/318; 310/335
(58) Field of Search ................ 134/1.3, 86, 153, 134/184, 198, 902; 310/318, 355, 340; 600/443, 463, 467; 128/399

(56) References Cited

U.S. PATENT DOCUMENTS

| | | | | |
|---|---|---|---|---|
| 3,893,869 A | * | 7/1975 | Mayer et al. | 134/86 |
| 4,804,007 A | * | 2/1989 | Bran | 134/184 |
| 4,869,278 A | * | 9/1989 | Bran | 134/184 |
| 4,938,217 A | * | 7/1990 | Lele | 128/399 |
| 5,911,232 A | * | 6/1999 | Mokuo et al. | 134/184 |
| 6,168,564 B1 | * | 1/2001 | Teo | 600/443 |
| 6,276,370 B1 | * | 8/2001 | Fisch et al. | 134/1.3 |

* cited by examiner

Primary Examiner—Randy Gulakowski
Assistant Examiner—Gentle Winter
(74) Attorney, Agent, or Firm—Dugan & Dugan

(57) ABSTRACT

Methods and apparatus are provided for cleaning a thin disc. In accordance with a first aspect, an apparatus is provided that includes a tank adapted to contain a fluid, and at least one support mechanism adapted to support a thin disc such that the thin disc is at least partially submerged in the fluid. The apparatus further includes a plurality of transducers each adapted to produce energy waves in the fluid, and a controller adapted to adjust the energy waves produced by each transducer so as to scan an energy wave maximum along a surface of a thin disc supported by the at least one support mechanism.

11 Claims, 2 Drawing Sheets

_US 6,554,003 B1_

METHOD AND APPARATUS FOR CLEANING A THIN DISC

The present application claims priority from U.S. Provisional Patent Application Ser. No. 60/162,741, filed Oct. 30, 1999, the contents of which are hereby incorporated by reference herein in their entirety.

The present application also claims priority from U.S. Provisional Patent Application Ser. No. 60/162,805, filed Nov. 1, 1999, the contents of which are hereby incorporated by reference herein in their entirety.

FIELD OF THE INVENTION

The present invention relates generally to methods and apparatus for cleaning thin discs, such as semiconductor wafers, compact discs, glass substrates and the like.

BACKGROUND OF THE INVENTION

A conventional method for cleaning particles from semiconductor wafers is known as megasonic cleaning. During megasonic cleaning, a transducer oscillates between compressed and strained states at or near a megahertz rate (e.g., at a "megasonic" rate). The transducer is coupled to a cleaning fluid; either cleaning fluid in a fluid filled tank, or cleaning fluid flowing through a nozzle. The megasonic oscillation of the transducer is thereby coupled to the fluid, causing a megasonic pressure oscillation therein. As the pressure in the cleaning fluid oscillates between positive and negative, cavitation or bubbles form in the cleaning fluid during negative pressure and collapse or shrink during positive pressure. This bubble formation/collapse gently cleans the surface of a wafer submerged in the cleaning fluid. Specifically, bubble implosion near the surface of the wafer helps to remove articles from the wafer and thus has a positive effect on cleaning efficiency.

One drawback of conventional cleaning methods is that bubbles in the cleaning fluid that are not near the wafer's surface may scatter energy transmitted by the transducer and thus cause a decreasing power density along the surface of the wafer as the distance from the transducer increases. Therefore, a wafer is typically translated or rotated during cleaning so that uniform megasonic energy scans the entire surface of the wafer. Wafer supports typically are used to rotate a wafer and to support the wafer during cleaning. However, contact between the moving wafer and the moving wafer supports may generate particles and/or damage the wafer during cleaning. Further, moving parts (e.g., rotating wafer supports) may be expensive to maintain and may require regular maintenance. As well, most conventional wafer supports block a portion of the megasonic energy generated by a transducer. Accordingly, a need exists for improved methods and apparatus for cleaning a thin disc such as a semiconductor wafer.

SUMMARY OF THE INVENTION

To overcome the drawbacks of the prior art, methods and apparatus are provided for cleaning a thin disc. In accordance with a first aspect of the invention, an apparatus is provided that includes a tank adapted to contain a fluid, and at least one support mechanism adapted to support a thin disc such that the thin disc is at least partially submerged in the fluid. The apparatus further includes a plurality of transducers each adapted to produce energy waves in the fluid, and a controller adapted to adjust the energy waves produced by each transducer so as to scan an energy wave maximum along a surface of a thin disc supported by the at least one support mechanism.

Other features and aspects of the present invention will become more fully apparent from the following detailed description of the preferred embodiments, the appended claims and the accompanying drawings.

DESCRIPTION OF THE INVENTION

Figure 1:
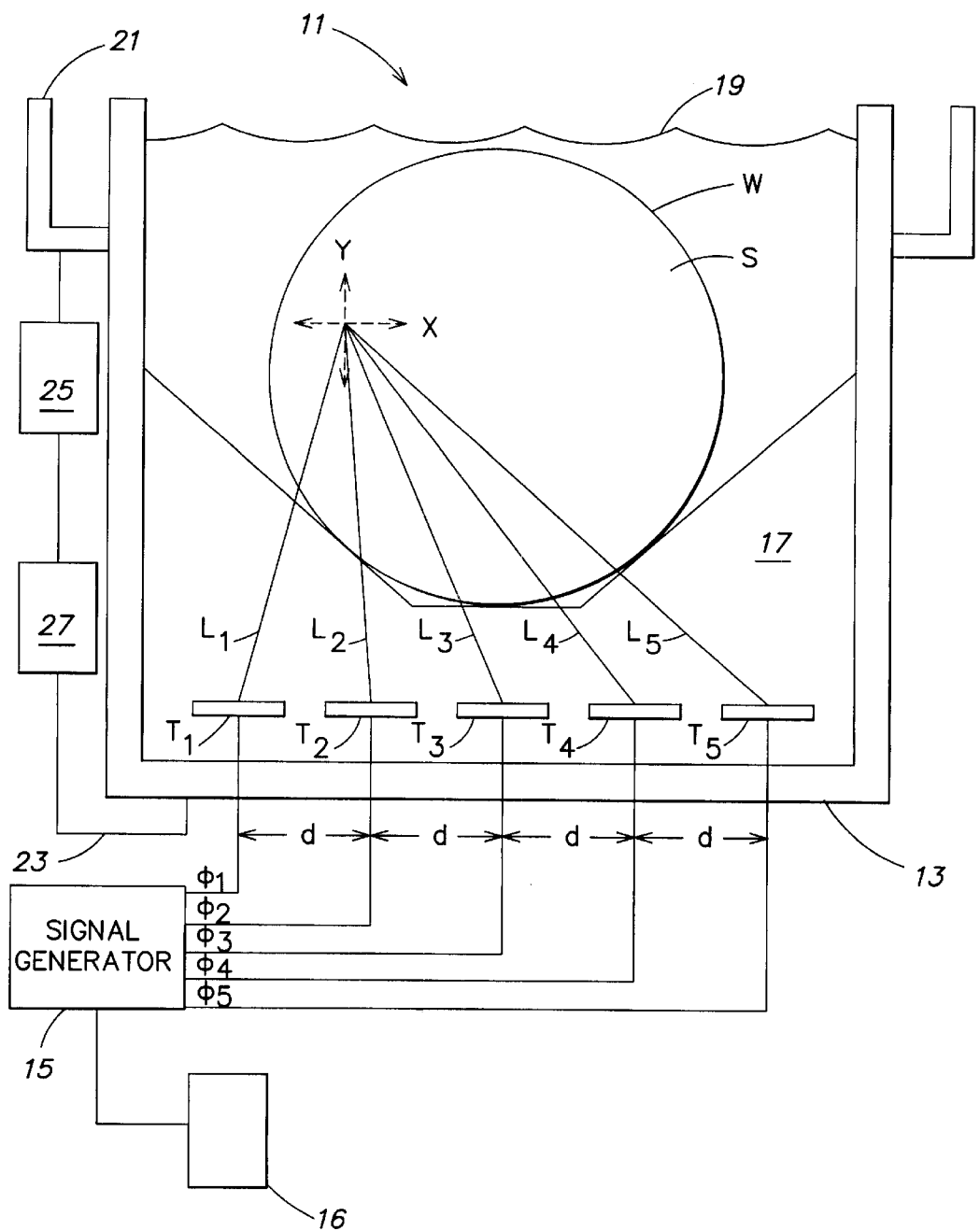
FIG. 1 is a schematic front elevational view of an inventive cleaning system configured in accordance with the present invention.

FIG. 1 is a schematic front elevational view of an inventive cleaning system 11 configured in accordance with the present invention. The inventive cleaning system 11 comprises a tank 13 (e.g., a plastic tank or some other conventional tank), having a plurality of transducers T1–T5 positioned along the bottom thereof. In general, the transducers T1–T5 may be positioned along any surface of the tank 13 (e.g., along a sidewall of the tank 13), and the number of transducers may vary. A signal generator 15 (e.g., a conventional RF power supply operating in the MHz frequency range for a megasonic cleaning system) is coupled to the transducers T1–T5 and is adapted to deliver a voltage signal having an individually controllable phase $\Phi1$–$\Phi5$ to each transducer T1–T5, respectively. A controller 16 (e.g., one or more conventional microcontrollers or microprocessors) is coupled to the signal generator 15 and may control the phase $\Phi1$–$\Phi5$ of each voltage signal that drives each transducer T1–T5, respectively, so as to scan an energy wave maximum across a surface S of the wafer W as described further below.

As shown in FIG. 1, the transducers T1–T5 are embedded in a quartz holder 17, which is configured to vertically support a wafer W such that the wafer W is submerged in a fluid 19 (e.g., a cleaning fluid such as an ammonium hydroxide solution, deionized water or some other known cleaning solution) contained within the tank 13. In one aspect of the invention, the quartz holder 17 is designed to minimize contact with the wafer W (e.g., by employing a "v" or "u" shaped groove along the surface of the quartz holder 17 that contacts the wafer). A significant advantage of using the quartz holder 17 is that energy waves (e.g., megasonic energy waves) produced by each transducer T1–T5 are not blocked by and can travel through the quartz holder 17, unlike many conventional wafer supports. Accordingly, all portions of the wafer W may be cleaned even if the wafer W is not rotated (as described below). Note that the shape of the quartz holder 17 shown in FIG. 1 also reduces the amount of fluid between the transducers T1–T5 and the wafer W (e.g., reducing the number of bubbles in the cleaning fluid that may scatter energy transmitted by the transducers T1–T5 and cause a decreasing power density along the surface of the wafer as the distance from each transducer increases, as previously described).

An overflow weir 21 is coupled near the top of the tank 13 so as to receive fluid that overflows from the tank 13.

A-fluid connection such as a pipe 23 provides a recirculation path along the bottom of the overflow weir 21, through a pump 25, through a filter 27, and along the bottom of the tank 13, so that the fluid 19 may be recirculated and cleaned as described below. The inventive cleaning system 11 may be configured, for example, as described in U.S. patent application Ser. No. 09/191,057, filed Nov. 11, 1998, the entire disclosure of which is incorporated herein by this reference.

In operation, the tank 13 is filled with the fluid 19 (e.g., a cleaning solution such as an ammonium hydroxide solution, deionized water or any other known cleaning solution). A wafer handler (not shown) then lowers the wafer W onto the quartz holder 17, thereby submerging the wafer W within the fluid 19. While the wafer W is shown as being completely submerged, it will be understood that the wafer W may be only partially submerged if only a portion of the wafer W is to be cleaned.

Once the wafer W has been placed within the fluid 19, the controller 16 directs the signal generator 15 to deliver a voltage signal (e.g., a MHz frequency voltage signal for megasonic cleaning) having a phase $\Phi 1-\Phi 5$ to the transducers T1–T5, respectively (e.g., a first voltage signal having a phase $\Phi 1$ is delivered to transducer T1, a second voltage signal having a phase $\Phi 2$ is delivered to transducer T2, etc.). In response to the voltage signal delivered to each transducer T1–T5, each transducer T1–T5 oscillates between a compressed and a strained state so as to generate energy waves (e.g., megasonic energy waves) in the fluid 19 that travel across the surface S of the wafer W.

By adjusting the phase $\Phi 1-\Phi 5$ of the voltage signal driving each transducer T1–T5, the controller 16 may select any position on the surface S of the wafer W at which the energy waves produced by each transducer T1–T5 generate an energy wave maximum due to constructive interference (e.g., the position of maximum cleaning energy). The position of an energy wave maximum due to constructive interference between the energy waves produced by each transducer T1–T5 depends on a number of factors including:

1. the distance between each transducer T1–T5 (e.g., the transducers are all spaced by a center-to-center distance d, but in general may be spaced by any distance and need not be uniformly spaced);
2. the distance L1–L5 between the point and each transducer T1–T5, respectively;
3. the operating frequency of each transducer T1–T5 (e.g., the voltage signals that drive the transducers T1–T5 are assumed to have the same frequency f, but in general may be operated at different frequencies); and/or
4. the phase $\Phi 1-\Phi 5$ of the voltage signal driving each transducer T1–T5.

The following equation predicts the amount of energy at any position (X,Y) based on the distance d between the transducers T1–T5, the distance L1–L5 between each transducer T1–T5 and the point (X,Y), and the phase $\Phi 1-\Phi 5$ and the frequency f of the voltage signal driving each transducer T1–T5:

$$E(X,Y)=E_{max}F(d,f,L1,L2,L3,L4,L5,\Phi 1,\Phi 2,\Phi 3,\Phi 4,\Phi 5)$$

Emax is the maximum possible energy due to constructive interference and F is a weighting function based on the various factors listed in 1–4 above.

During cleaning, the controller 16 adjusts (e.g., continuously, periodically or randomly) the phase $\Phi 1-\Phi 5$ of the voltage signal driving each transducer T1–T5 so as to scan the energy wave maximum across the surface S of the wafer W (e.g., by scanning the energy wave maximum along the x and y directions of the x-y plane defined by the surface S). In this manner, the entire surface S of the wafer W may receive an energy wave maximum (e.g., the maximum total of energy deliverable by the transducers T1–T5) to improve wafer cleaning.

Also during cleaning, the fluid 19 is continually pumped through the pipe 23 to the tank 13. The fluid 19 in the tank 13 therefore continually spills over the top of the tank 13 and into the overflow weir 21. The fluid 19 is then pumped from the overflow weir 21 through the filter 27 and back into the bottom of the tank 13, via the pump 25. Particles cleaned from the surface of the wafer W typically collect on the top of the fluid 19. Because the fluid 19 continually overflows into the overflow weir 21, the particles are therefore continually swept from the top surface of the fluid into the overflow weir 21. The filter 27 then filters the particles from the fluid 19 and the fluid 19 is pumped back into the tank 13.

Figure 2A:
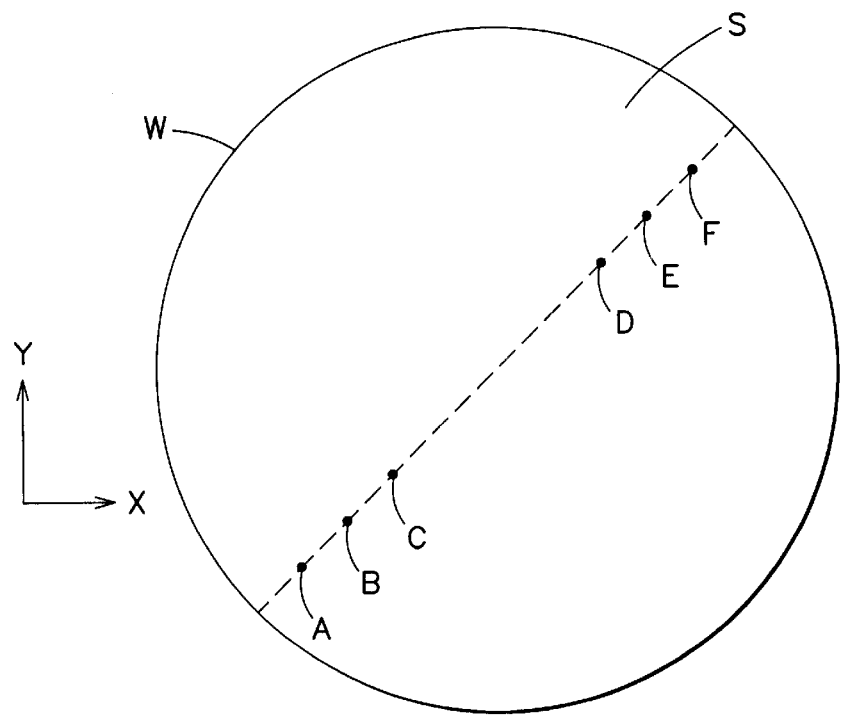
FIG. 2A is a top view of a semiconductor wafer useful in describing the operation of the present invention.

FIG. 2A is a front view of the wafer W of FIG. 1 useful in describing the operation of the present invention.

Figure 2B:
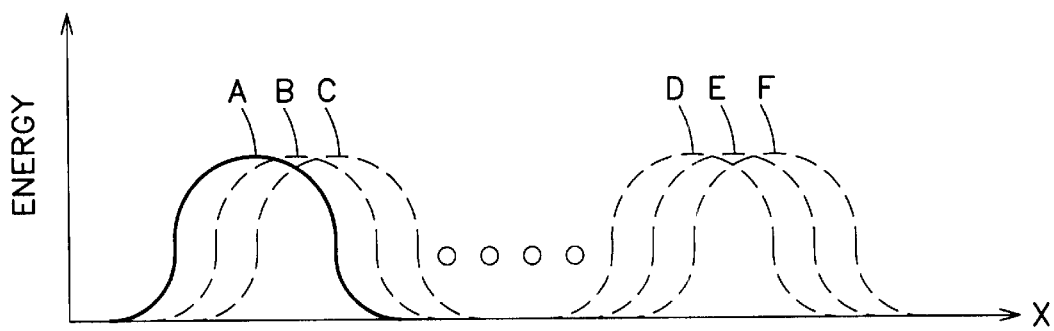
FIG. 2B is an exemplary diagram of energy striking the semiconductor wafer of FIG. 2A versus position along the semiconductor wafer as viewed along the x-direction in FIG. 2A.
Figure 2C:
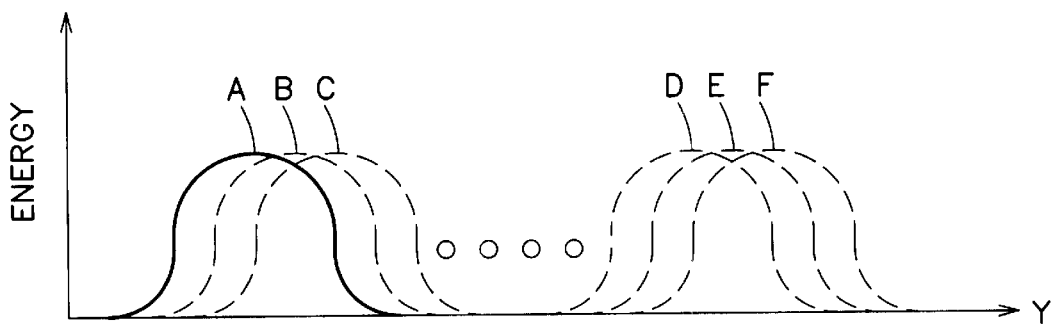
FIG. 2C is an exemplary diagram of energy striking the semiconductor wafer of FIG. 2A versus position along the semiconductor wafer as viewed along the y-direction in FIG. 2A.

FIG. 2B is an exemplary diagram of energy versus position across the wafer W as viewed along the x-direction in FIG. 2A. FIG. 2C is an exemplary diagram of energy versus position across the wafer W as viewed along the y-direction in FIG. 2A. As described above, the controller 16 may adjust the phase relationship between the transducers T1–T5 so as to scan an energy wave maximum along the x-direction and the y-direction of the surface S of the wafer W. For simplicity, FIGS. 2B and 2C each shows six locations (e.g., locations A, B, C, D, E and F) across the surface S of the wafer W at which an energy wave maximum has been positioned by adjusting the phase of each voltage signal that drives each transducer T1–T5 (e.g., only one energy wave maximum may be present at a time).

As is evident from the description above, an energy wave maximum may be scanned along the entire surface of a wafer without having to rotate the wafer W. Thus, the inventive cleaning system 11 may reduce or eliminate the need for moving parts during wafer cleaning (e.g., reducing particle generation and maintenance costs associated with the inventive cleaning system 11). The design of the quartz holder 17 also reduces the amount of fluid between the transducers T1–T5 and the wafer W (e.g., reducing the number of bubbles in the cleaning fluid that may scatter energy transmitted by the transducers T1–T5 and cause a decreasing power density along the surface of the wafer as the distance from each transducer increases as previously described).

The foregoing description discloses only exemplary embodiments of the invention, modifications of the above-disclosed apparatus and method which fall within the scope of the invention will be readily apparent to those of ordinary skill in the art. For instance, the wafer W need not be vertically oriented, and the position and shape of the quartz holder 17 may vary to accommodate alternative wafer positions. The wafer support may comprise mechanisms other than that shown. The inventive cleaning methods and apparatus can be used within any tank cleaning systems including those which employ additional features to facilitate major surface cleaning, and/or edge cleaning. As used herein, a substrate or a wafer includes, but is not limited to a semiconductor wafer with or without material layers thereon, whether patterned or unpatterned. Although the transmitted energy is preferably megasonic, other frequencies may be employed. The transducers may be of any size, shape, number and configuration (e.g., the transducers need not be placed within a straight line, need not be oriented horizontally, may be curved or may form a curved shape, etc.).

Accordingly, while the present invention has been disclosed in connection with the preferred embodiments thereof, it should be understood that other embodiments may fall within the spirit and scope of the invention, as defined by the following claims.

The invention claimed is:

1. An apparatus for cleaning a thin disc comprising:
   a tank adapted to contain a fluid;
   at least one support mechanism adapted to support a thin disc such that the thin disc is at least partially submerged in the fluid;
   a plurality of transducers, each transducer adapted to produce energy waves in the fluid; and
   a controller coupled to the plurality of transducers and adapted to adjust the energy waves produced by each transducer so as to scan an energy wave maximum along a surface of a thin disc supported by the at least one support mechanism;
   wherein:
   the at least one support mechanism comprises a quartz holder so that energy waves produced by the transducers may be transmitted through the quartz holder; and
   the transducers are embedded in the quartz holder.

2. The apparatus of claim 1 further comprising a power supply coupled to each transducer and adapted to deliver a voltage signal having a phase to each transducer.

3. The apparatus of claim 2 wherein the controller is adapted to adjust the phase of each voltage signal delivered to each transducer so as to scan an energy wave maximum along the surface of the thin disc.

4. The apparatus of claim 1 wherein each transducer is adapted to produce megasonic energy waves in the fluid.

5. The apparatus of claim 1 wherein the at least one support mechanism comprises a non-rotatable support mechanism.

6. The apparatus of claim 1 wherein the controller is adapted to adjust the energy waves produced by each transducer so as to scan an energy wave maximum along each point of the surface of the thin disc.

7. A method of cleaning a thin disc comprising:
   submerging at least a portion of a thin disc in a tank containing a fluid by supporting the thin disc on a quartz holder located within the tank, the tank having a plurality of transducers, each transducer adapted to supply sonic energy to the fluid;
   supplying power to the transducers so as to transmit sonic energy to the thin disc via the fluid;
   generating an energy wave maximum based on the sonic energy supplied by each transducer; and
   scanning the energy wave maximum along a surface of the thin disc;
   wherein the transducers are embedded in the quartz holder.

8. The method of claim 7 wherein supplying power to the transducers comprises supplying a voltage signal having a phase to each transducer.

9. The method of claim 8 wherein generating an energy wave maximum comprises adjusting the phase of each voltage signal delivered to each transducer so as to generate the energy wave maximum.

10. The method of claim 8 wherein scanning the energy wave maximum comprises adjusting the phase of each voltage signal delivered to each transducer so as to scan the energy wave maximum.

11. The method of claim 7 wherein scanning the energy wave maximum along the surface of the thin disc comprises scanning the energy wave maximum along each point of the surface of the thin disc.

* * * * *